United States Patent [19]
Saenger et al.

[11] Patent Number: 6,131,258
[45] Date of Patent: Oct. 17, 2000

[54] SIDEWALL CAPACITOR WITH L-SHAPED DIELECTRIC

[75] Inventors: Katherine Lynn Saenger, Ossining; James H. Comfort, New City; Alfred Grill, White Plains; David Edward Kotecki, Hopewell Junction, all of N.Y.

[73] Assignee: International Business Machines Corporation, Armonk, N.Y.

[21] Appl. No.: 08/908,295

[22] Filed: Aug. 7, 1997

Related U.S. Application Data

[62] Division of application No. 08/577,165, Dec. 22, 1995, Pat. No. 5,712,759.

[51] Int. Cl.[7] ................................................ H01G 7/00
[52] U.S. Cl. .......................... 29/25.42; 257/300; 438/239
[58] Field of Search ........................... 29/25.41, 25.42, 29/846; 257/68, 298, 300, 301, 306, 906; 438/243, 239, 381, 393, 396, 901, 186

[56] References Cited

U.S. PATENT DOCUMENTS

| | | | |
|---|---|---|---|
| 4,757,028 | 7/1988 | Kondoh et al. | 437/40 |
| 4,845,046 | 7/1989 | Shimbo | 437/41 |
| 4,882,649 | 11/1989 | Chen et al. | 361/313 |
| 5,245,505 | 9/1993 | Shiga et al. | 361/311 |
| 5,290,716 | 3/1994 | Nakamura | 437/31 |
| 5,384,729 | 1/1995 | Sameshima | 365/145 |
| 5,523,542 | 6/1996 | Chen et al. | 29/121.41 |

*Primary Examiner*—Lee Young
*Assistant Examiner*—Kevin G. Vereene
*Attorney, Agent, or Firm*—Alison D. Mortinger; Jay H. Anderson

[57] ABSTRACT

A capacitor structure with a generally L-shaped non-conductor having a horizontal portion and a vertical portion, the vertical portion defining a first opening formed therein; a generally U-shaped conductor formed within the first opening; and a generally L-shaped conductor formed exterior to the generally L-shaped non-conductor.

9 Claims, 6 Drawing Sheets

SIDEWALL CAPACITOR WITH L-SHAPED DIELECTRIC

RELATED APPLICATIONS

The application is a division of application Ser. No. 08/577,165, filed Dec. 22, 1995 now U.S. Pat. No. 5,712,759.

This invention is related to the following U.S. patent applications:

1) Ser. No. 08/577,178, Dec. 22, 1995, U.S. Pat. No. 5,914,851, entitled "Isolated Sidewall Capacitor";

2) Ser. No. 08/577,168, Dec. 22, 1995, now U.S. Pat. No. 5,633,781, entitled "Isolated Sidewall Capacitor Having a Compound Plate Electrode";

3) Ser. No. 08/577,166, Dec. 22, 1995 now U.S. Pat. No. 5,585,998, entitled "Isolated Sidewall Capacitor with Dual Dielectric";

all filed on the same day, assigned to the present assignee, and incorporated by reference in their entireties.

FIELD OF THE INVENTION

This invention is directed to capacitors and the manufacture of the same, and more particularly to a capacitor employing an structure which is suitable for use with high dielectric constant materials.

BACKGROUND OF THE INVENTION

In the manufacture of ultra large scale integration (ULSI) circuit devices, DRAM (dynamic random access memory) and FRAM (ferroelectric random access memory) chips have become increasingly dense. As density increases, feature size shrinks, and so too does memory cell size. The capacitors that are an integral part of memory cells must therefore take up a minimum of space (i.e. have a small "footprint") and still be capable of storing large amounts of electrical charge (i.e. a capacitance on the order of 30 Ff).

Capacitance is a function of dielectric area and the dielectric constant of the dielectric material, and is inversely proportional to the thickness of the dielectric. Thus one method of achieving increased capacitance in a smaller area is to use materials with higher dielectric constants as dielectrics. However, the use of high dielectric constant materials presents a problem when using traditional materials like silicon as an electrode. The silicon can react with the high dielectric constant material or oxidize during deposition of the high dielectric constant material and form an interface layer of silicon dioxide, which reduces the effective dielectric constant of the dielectric material.

Deposition temperature and leakage are other problems involved in high-dielectric constant materials. Because they must be deposited at relatively high temperatures, the first-deposited electrode is formed from a high melting point conductive material which does not oxidize or react with the dielectric. In addition, the electrode material should have a large work function to increase the height of the Schottky barrier. Platinum (Pt) and other similar materials are suitable for use as electrodes in this situation. However, these electrode materials are typically difficult to pattern using conventional processes. For example, using reactive ion etching (RIE) to pattern Pt results in sloped sidewalls which, given a thick layer, can result in a significant reduction of available surface area on which to form the capacitor. Additionally, while high dielectric constant materials must be isolated from silicon, a good connection must be formed between the capacitor and the semiconductor circuit elements in the substrate. Also, the dielectric should be mechanically stable.

Thus, there remains a need for a capacitor which can be produced using high dielectric constant materials yet avoids the problems associated with a reduction in the effectiveness of the finished structure.

SUMMARY OF THE INVENTION

It is therefore an object of the present invention to provide a capacitor which incorporates a high dielectric constant material which minimizes or avoids contact between silicon and the high dielectric constant material, especially during high dielectric constant material deposition.

It is a further object to provide a capacitor which incorporates a high dielectric constant material which minimizes patterning steps for the electrodes.

It is another object to provide a capacitor which incorporates a high dielectric constant material which allows a good connection between the capacitor and the semiconductor circuit elements in the substrate.

It is yet another object to provide a capacitor which incorporates a high dielectric constant material which is suitable for large scale production.

In accordance with the above listed and other objects, a capacitor structure is provided with a generally L-shaped non-conductor having a horizontal portion and a vertical portion, the vertical portion defining a first opening formed therein; a generally U-shaped conductor formed within the first opening; and a generally L-shaped conductor formed exterior to the generally L-shaped non-conductor.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
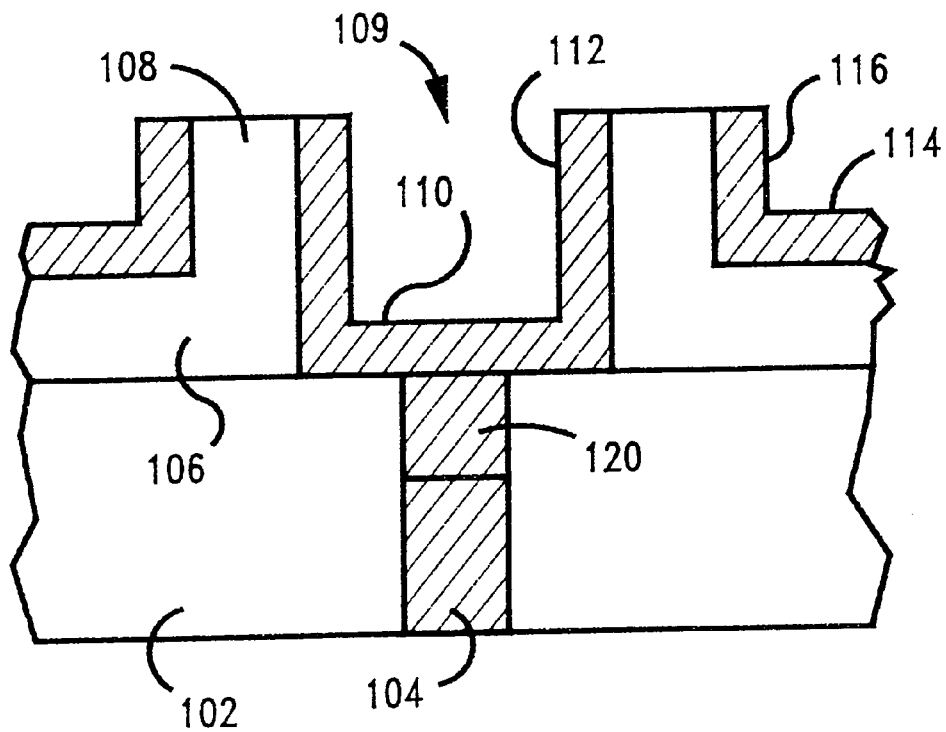
FIG. 1 shows a capacitor with L-shaped dielectric.

Referring now to the drawings and more particularly to FIG. 1, one embodiment of the capacitor is shown. A substrate (not shown) has a dielectric (non-conductive) layer 102 formed thereon, and a conductive plug 104 embedded in layer 102. Plug 104 provides contact to the desired circuit elements in the substrate (also not shown). An optional electrically conductive diffusion barrier 120 may be located on top of plug 104. A generally L-shaped dielectric 106 with vertical portion 108 is formed on top of layer 102. Dielectric 106 has an opening 109 exposing plug 104. When dielectric 106 is viewed from above it is predominantly annular or oval. A generally U-shaped bottom electrode 110 with vertical portions 112 is positioned inside opening 109 and contacting dielectric 106. A generally L-shaped top electrode 114 with vertical portion 116 is positioned in the L formed by dielectric 106, as shown. Either or both of the electrodes may optionally be filled with a fill material 118.

Note that an array of such capacitors will have a connected plate electrode and that L-shaped top electrode 114 will appear to be U-shaped when viewed together with the neighboring capacitor.

Figure 2A:
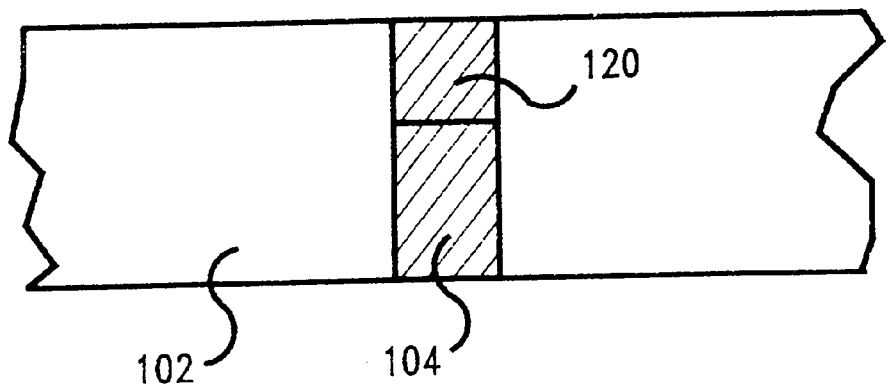
FIGS. 2(a) through 2(i) illustrate one set of steps that may be used to manufacture the capacitor of FIG. 1.
Figure 2:
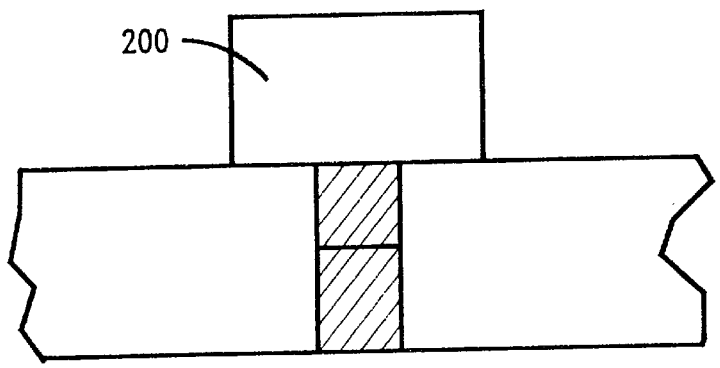
Figure 2:
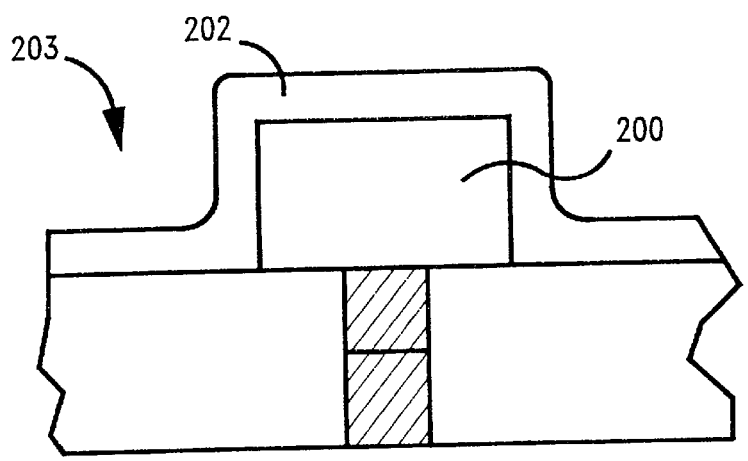
Figure 2:
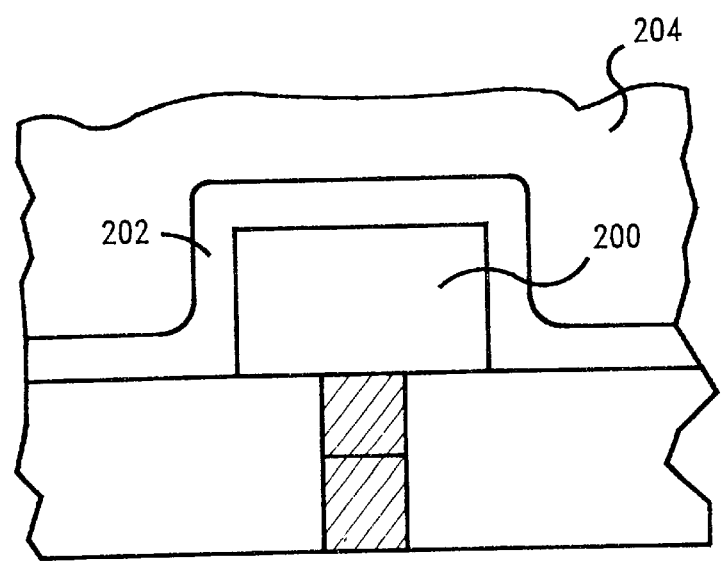

FIGS. 2(a) through 2(i) illustrate one set of steps that may be used to manufacture the capacitor of FIG. 1. In FIG. 2(a), dielectric layer 102 has been formed on the substrate (not shown), and patterned by conventional means, for example by reactive ion etching (RIE). Dielectric layer 102 may be $SiO_2$, $SiN_x$, phosphosilicate glass (PSG), borophosphosilicate glass (BPSG), a flowable oxide, spin-on-glass, or similar materials. Note also that more than one dielectric layer can be used in place of single layer 102, so that the topmost layer can function as an etch stop in subsequent process steps, for example. Conductive plug 104 has been formed by a conventional process such as chemical vapor deposition (CVD) followed by planarization by chemical mechanical polishing (CMP), for example. Plug 104 may be doped polysilicon, W, or any suitably conductive material. Note that the diameter of plug 104 is not critical, and may be significantly narrower or wider than as shown. After an etch-back process to recess plug 104 below the surface of dielectric 102, diffusion barrier 120 has been formed again by a conventional process such as sputtering, and may be $Ta_{1-x}Si_xN_y$ (with 0<x<1 and y>0), TiN, or similar materials.

In FIG. 2(b), a layer of disposable material is formed and patterned by conventional means, for example CVD followed by reactive ion etching (RIE) to leave a freestanding disposable plug 200 over conductive plug 104. Disposable plug 200 is preferably an oxidation resistant material that can withstand the dielectric deposition temperature, such as $SiO_2$, $SiN_x$, TaSiN, etc.

In FIG. 2(c), a layer of high dielectric constant material 202 is formed conventionally, for example by chemical vapor deposition (CVD) or any other process which produces a nearly uniform thickness on the vertical portion of disposable plug 200, leaving opening 203. High dielectric constant material 202 may be selected from the groups of materials known as ferroelectrics, paraelectrics, perovskites, layered perovskites, relaxors, pyrochlores, or any material with a dielectric constant roughly greater than or equal to 20. Examples of such materials are $Ta_2O_5$, $(Ta_2O_5)_x(TiO_2)_{1-x}$ with 0<x<1, $PbMg_xNb_{1-x}O_{3+y}$ with 0<x<0.5, 0<y<1 (PMN), (Ba,Sr)$TiO_3$ (BST or BSTO), $SrBiTaO_3$ (SBT), $BaTiO_3$, $SrTiO_3$, $PbZr_{1-x}Ti_xO_3$ (PZT), $PbZrO_3$, $Pb_{1-x}La_xTiO_3$ (PLT), and $Pb_{1-x}La_x(Zr_yTi_{1-y})_{1-x/4}O_3$ (PLZT). Note that the conductive plug material is protected by the disposable plug material against oxidation during the high dielectric constant material deposition.

In FIG. 2(d), a layer of material which can be easily planarized 204 is formed conventionally, for example by CVD or sputter deposition, on layer 202, ensuring that opening 203 is completely filled. Note that optionally a polish/etch stop (not shown) may be formed over layer 202 before layer 204 is formed. Material 204 may be the same materials as disposable plug 200 plus materials such as polysilicon or TiN which may not be as oxidation resistant.

Figure 2E:
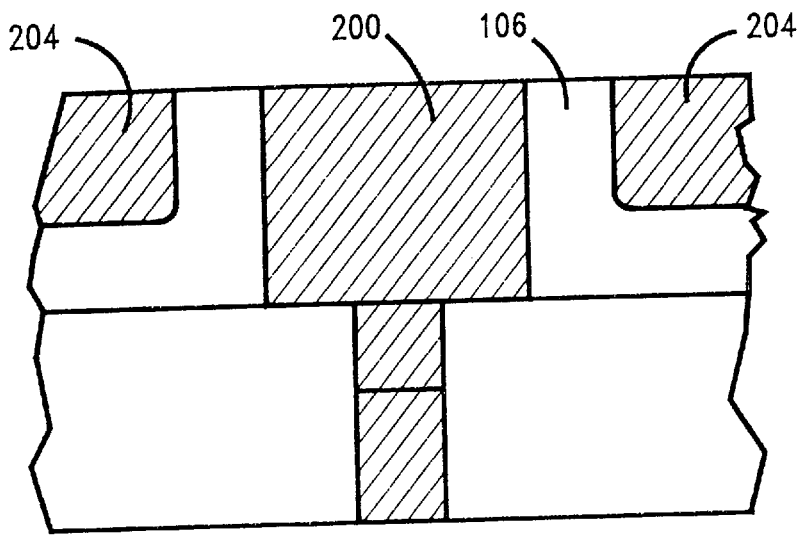
Figure 2F:
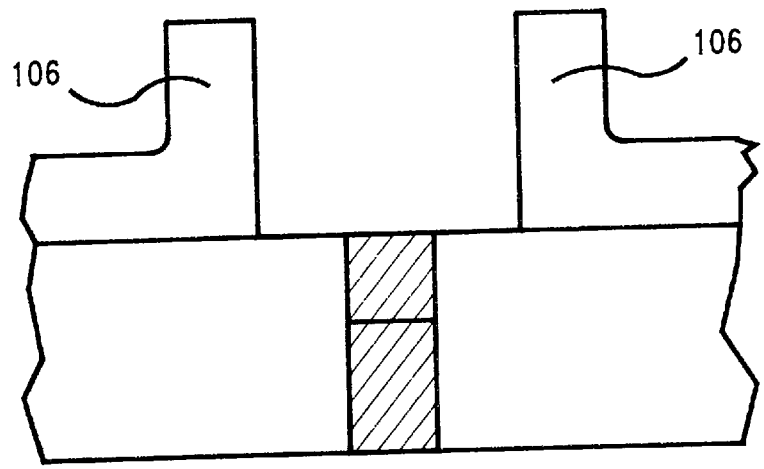

In FIG. 2(e), layer 204 is planarized by conventional means, for example by chemical-mechanical polishing (CMP), stopping on layer 202. The exposed horizontal portions of layer 202 are then removed for example by a non-selective blanket reactive ion etch to form dielectric 106. Alternately, the horizontal portions of layer 202 could be removed by a continued CMP. Plug 200 and layer 204 (as well as the optional polish/etch stop) are then removed together or sequentially by a chemically selective etch process such as RIE to leave the structure shown in FIG. 2(f).

Figure 2G:
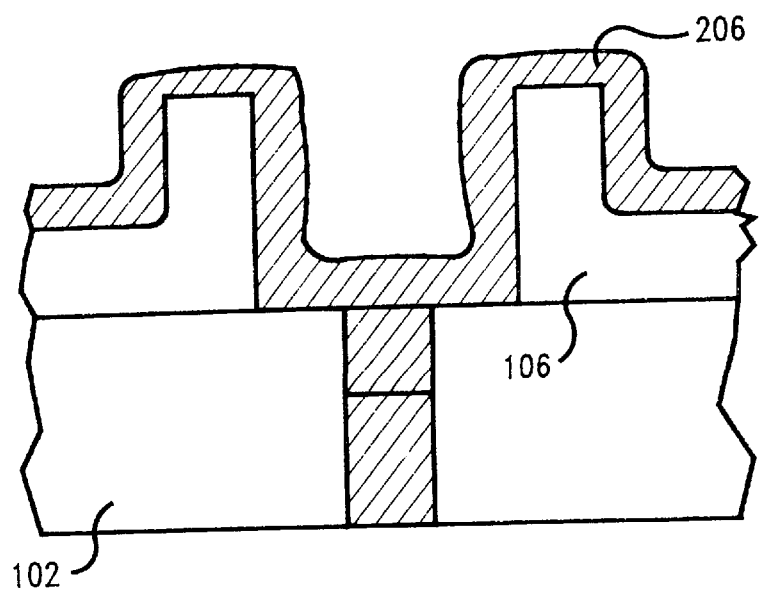

In FIG. 2(g), a conductive (preferably conformal) layer 206 is formed conventionally, for example by CVD or sputter deposition, over layer 102 and dielectric 106. Conductive layer 206 may be selected from any metal or from the groups of materials known as noble metals (e.g. Au, Pt, Pd, Ir, Rh, etc.), alloys of noble metals with either noble or non-noble metals, metals whose oxides are conducting (e.g. Ru, Mo, etc.), electrically conducting oxides (e.g. $RuO_2$, $IrO_2$, $Re_2O_3$, etc.), electrically conducting nitrides (e.g. TiN, TaN, TaSiN, WN, etc), or similar materials. Conductive layer 206 is also preferably between 100 and 1000 Å thick.

Figure 2H:
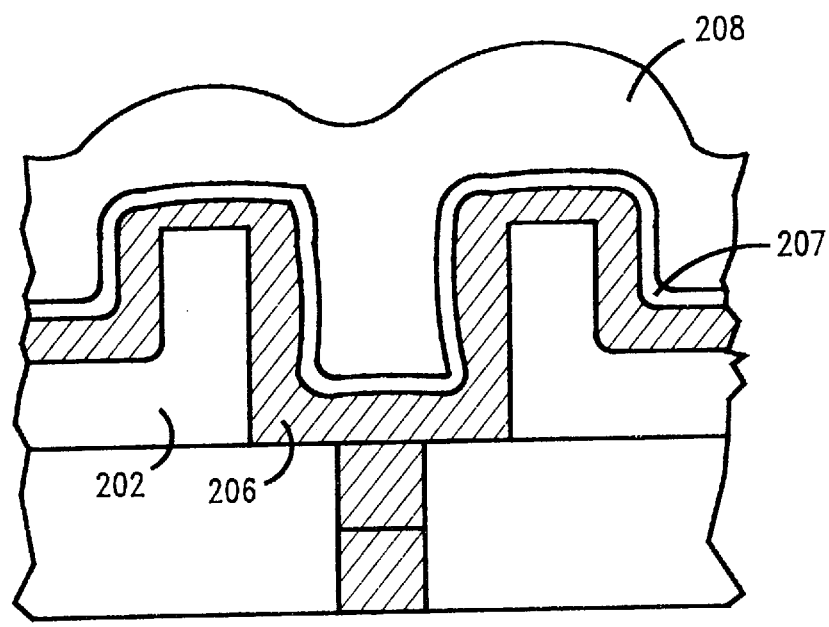
Figure 2I:
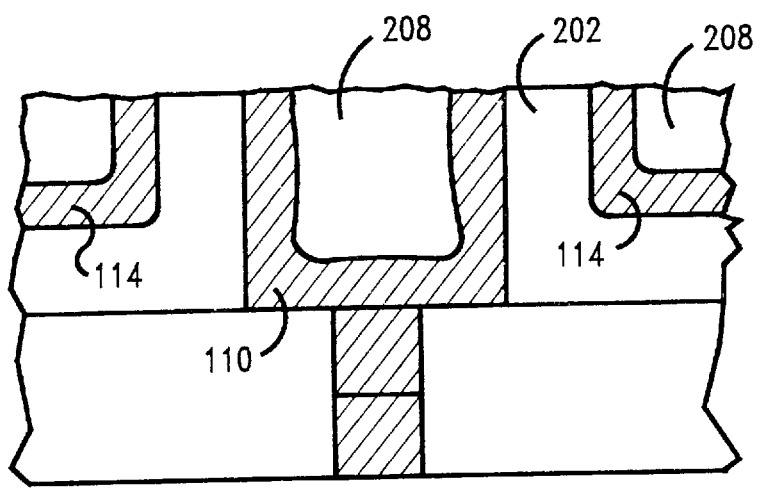

In FIG. 2(h), an optional etch or polish stop layer 207 is formed over layer 206, followed by another easily planarizable layer 208. Polish/etch stop layer 207 may be for example diamond-like carbon, and may also function as an adhesion layer. Note that layer 207, if used, will end up in the finished structure shown in FIG. 1, however it will not be shown in subsequent Figures. Like layer 204, layer 208 may be formed conventionally by CVD or sputter deposition, for example. In FIG. 2(i), the two electrodes 110 and 114 are formed by removing the portions of layers 206 and 208 covering the top of dielectric 202. Any of several methods may be employed to isolate electrodes 110 and 114, for example CMP, non-selective ion-beam sputter etching, or a selective reactive ion etch (RIE) to first remove layer 208, followed by a selective wet etch to remove the desired portions of layer 206. If desired, the remaining portions of layer 208 may be removed for example by a selective RIE process, or other conventional means. If left in place, the remaining portions of layer 208 form a fill material. If fill 208 is conductive and the optional polish stop is not used, the fill will decrease the resistivity of a very large plate electrode in an array of capacitors.

Figure 3:
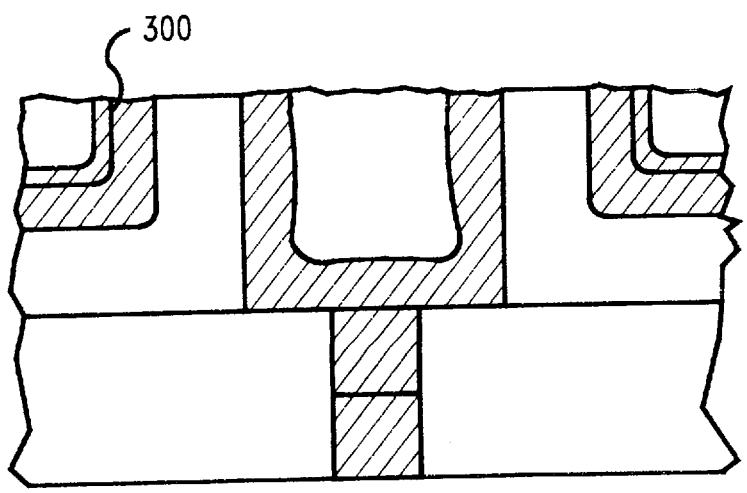
FIG. 3 shows the capacitor with a dual layer top electrode.

FIG. 3 shows the capacitor with a dual layer top electrode. FIG. 3 is similar to FIG. 1 except that top electrode 300 is thicker than top electrode 114, and has been formed in two separate steps.

Figure 4A:
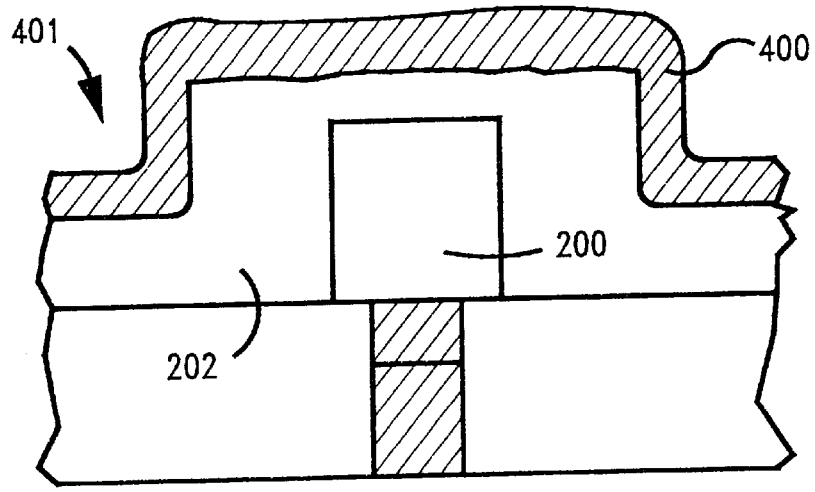
FIGS. 4(a) through 4(d) illustrate alternate steps to those shown in FIGS. 2(d) through 2(g) that may be used to manufacture the capacitor of FIG. 3, all in accordance with the present invention.

FIGS. 4(a) through 4(d) illustrate alternate steps to those shown in FIGS. 2(d) through 2(g) that may be used to manufacture the capacitor of FIG. 3. In FIG. 4(a), a conductive layer 400 is formed on dielectric 202 from the structure of FIG. 2(c), leaving opening 401. Conductive layer 400 may be selected from the same group of materials as conductive layer 206 from FIG. 2(h), and formed by sputter deposition or other conventional means. Note that layer 400 is preferably conformal to dielectric 202.

Figure 4B:
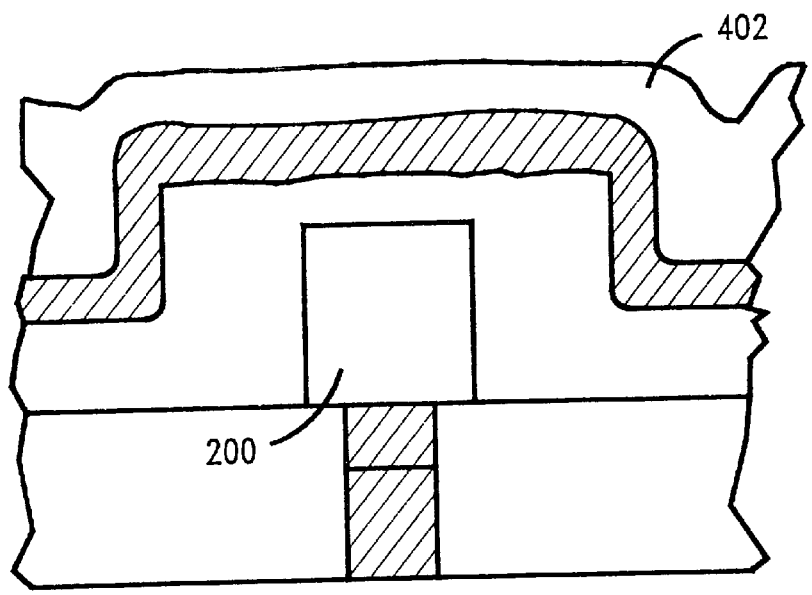
Figure 4C:
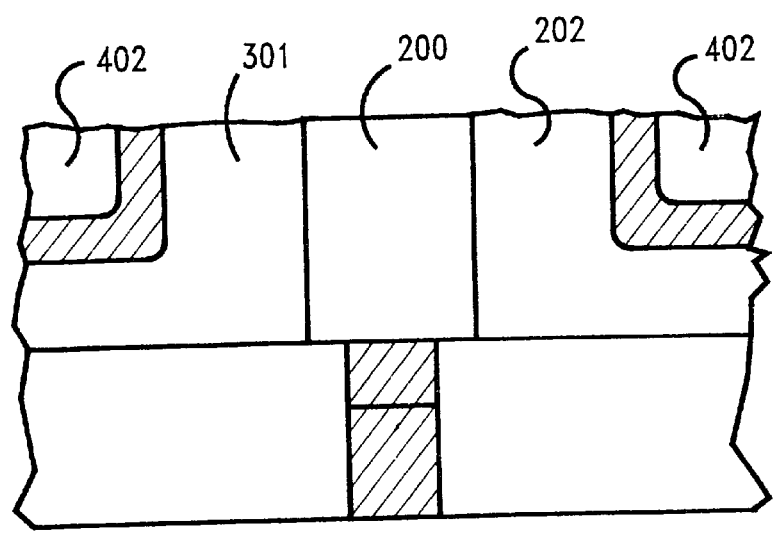
Figure 4D:
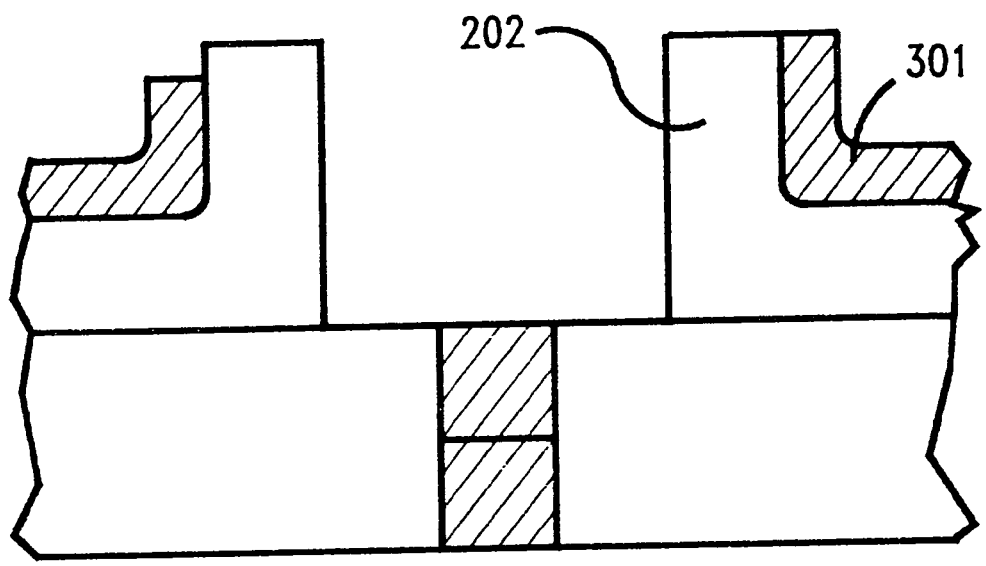

In FIG. 4(b), a layer of material 402 which can be easily planarized is formed conventionally, for example by sputter deposition, on layer 400, ensuring that opening 401 is completely filled. Material 402 may be spin-on-glass, $SiO_2$, TiN, $SiN_x$, etc. for example. In FIG. 4(c), layers 202, 400, and 402 are planarized by conventional means, for example by chemical-mechanical polishing (CMP), stopping on disposable plug 200, to form the first layer 301 of top electrode 300. The remaining portions of layer 402 are removed together or sequentially by a chemically selective etch process such as RIE to leave the structure shown in FIG. 4(d). Processing continues as shown in FIGS. 2(g) through 2(i), resulting in the dual-layer top electrode.

The resulting capacitor structures having an L-shaped non-conductor (dielectric) have some important advantages over solely vertical sidewalls. A solely vertical sidewall is formed by a blanket anisotropic etch of a dielectric layer (in this case, a high dielectric constant material) conformally deposited over a disposable plug. Once face of the vertical sidewall is thus exposed to relatively harsh etching conditions and redeposits of material sputtered during the etch. In contrast, the vertical portion of the L is protected on both sides during the critical high dielectric constant material patterning step by disposable materials which can be removed after the patterning by a more gentle, chemically selective and/or isotropic etch. Second, the L shape lends increased mechanical integrity to the structure.

More generally, forming the dielectric first before the top or bottom electrodes, and then depositing both electrodes in a single step has several advantages as well. A RIE step for patterning the electrodes is unnecessary, and processing after electrode deposition can be done at lower temperatures. Any problems associated with changes in the electrode morphology (e.g. surface roughening or hillocking at high temperatures) during dielectric formation are eliminated. Also, production of highly textured platinum with proper orientation for both the top and bottom electrodes is possible, allowing for process simplification and improved capacitor performance. In addition, both surfaces of the dielectric can be cleaned prior to depositing the electrode material, and thus any interfacial layer can be removed.

In summary, a capacitor has been provided which incorporates a high dielectric constant material and which minimizes or avoids contact between silicon and the high dielectric constant material, especially during high dielectric constant material deposition. Furthermore, the capacitor minimizes patterning steps for the electrodes, and allows a good connection between the capacitor and the semiconductor circuit elements in the substrate. The capacitor is therefore suitable for large scale production.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of making a capacitor structure, comprising the steps of:

forming a generally L-shaped non-conductor on a dielectric underlying layer, including the steps of forming a disposable plug on the underlying layer, the disposable plug having a substantially horizontal surface and at least one substantially vertical surface, forming a layer of non-conductive material over the disposable plug, the layer of non-conductive material having a first horizontal portion on the underlying layer, a second horizontal portion on the horizontal surface of the disposable plug and a vertical portion with a substantially uniform thickness on the substantially vertical surface of the disposable plug, forming a layer of planarizable material on the layer of non-conductive material, the layer of planarizable material covering the second horizontal portion of the non-conductive layer, planarizing the layer of planarizable material to expose the second horizontal portion of the non-conductive layer, and removing the disposable plug, the generally L-shaped non-conductor having a horizontal portion and a vertical portion, the vertical portion having a first opening formed in said vertical portion, thereby defining an exposed portion of the underlying layer;

forming a generally U-shaped conductor within the first opening and covering said exposed portion of the underlying layer; and forming a generally L-shaped conductor exterior to the generally L-shaped non-conductor.

2. The method of claim 1 wherein the step of planarizing the layer of planarizable material comprises chemical mechanical polishing.

3. The method of claim 1 wherein the step of planarizing the layer of planarizable material comprises blanket etching.

4. The method of claim 1 wherein the generally U-shaped conductor and the generally L-shaped conductor exterior are formed at the same time.

5. The method of claim 1 wherein the steps of forming the generally U-shaped conductor and forming a generally L-shaped conductor further comprise the steps of:

forming a layer of conductive material over the generally L-shaped non-conductor, the layer of conductive material defining an opening therein;

forming a layer of planarizable material over the layer of conductive material, the layer of planarizable material being at least as thick to cover the conductive layer; and planarizing the planarizable material and the conductive layer to expose the generally L-shaped non-conductor.

6. The method of claim 5 wherein the step of planarizing the layer of planarizable material comprises chemical mechanical polishing.

7. The method of claim 6 further comprising the step of forming a polish stop between the layer of conductive material and the layer of planarizable material.

8. The method of claim 1 wherein the underlying layer is non-conductive, and further comprising the step of forming a second opening in the underlying layer, at least part of the second opening positioned underneath the first opening.

9. The method of claim 8 further comprising the step of forming a conductive plug in the second opening, the conductive plug being in electrical contact with the generally U-shaped conductor.

* * * * *